(12) United States Patent
Koga et al.

(10) Patent No.: US 8,368,161 B2
(45) Date of Patent: Feb. 5, 2013

(54) SOLID-STATE IMAGE CAPTURING DEVICE, METHOD OF MANUFACTURING SOLID-STATE IMAGE CAPTURING DEVICE, AND IMAGE CAPTURING APPARATUS

(75) Inventors: Fumihiko Koga, Kanagawa (JP); Yoshiharu Kudoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 512 days.

(21) Appl. No.: 12/711,345

(22) Filed: Feb. 24, 2010

(65) Prior Publication Data
US 2010/0225775 A1 Sep. 9, 2010

(30) Foreign Application Priority Data
Mar. 4, 2009 (JP) ................. 2009-050130

(51) Int. Cl.
*H01L 21/337* (2006.01)
(52) U.S. Cl. ........ 257/446; 257/448; 257/435; 438/196; 438/207
(58) Field of Classification Search .................. 257/446, 257/448, 435; 438/196, 207, 218, 221, 248, 438/295, 318, 353, 355, 359
See application file for complete search history.

(56) References Cited

U.S. PATENT DOCUMENTS
7,354,812 B2 * 4/2008 Batra et al. ................. 438/196

FOREIGN PATENT DOCUMENTS
JP 2006-093222 4/2006

* cited by examiner

*Primary Examiner* — Michael Shingleton
(74) *Attorney, Agent, or Firm* — SNR Denton US LLP

(57) ABSTRACT

A solid-state image capturing device includes, in a semiconductor substrate, a photoelectric conversion section which performs photoelectric conversion on incident light to obtain signal charges; a pixel transistor section which outputs the signal charges generated in the photoelectric conversion section; a peripheral circuit section which is formed in the periphery of a pixel section including the photoelectric conversion section and the pixel transistor section; and isolation areas which electrically separate the photoelectric conversion section, the pixel transistor section, and the peripheral circuit section from each other. The isolation areas in the periphery of the pixel transistor section each have an insulating section formed higher than a surface of the semiconductor substrate. A first gate electrode of a transistor of the pixel transistor section is formed between the insulating sections and on the semiconductor substrate with a gate insulating film interposed therebetween.

8 Claims, 12 Drawing Sheets

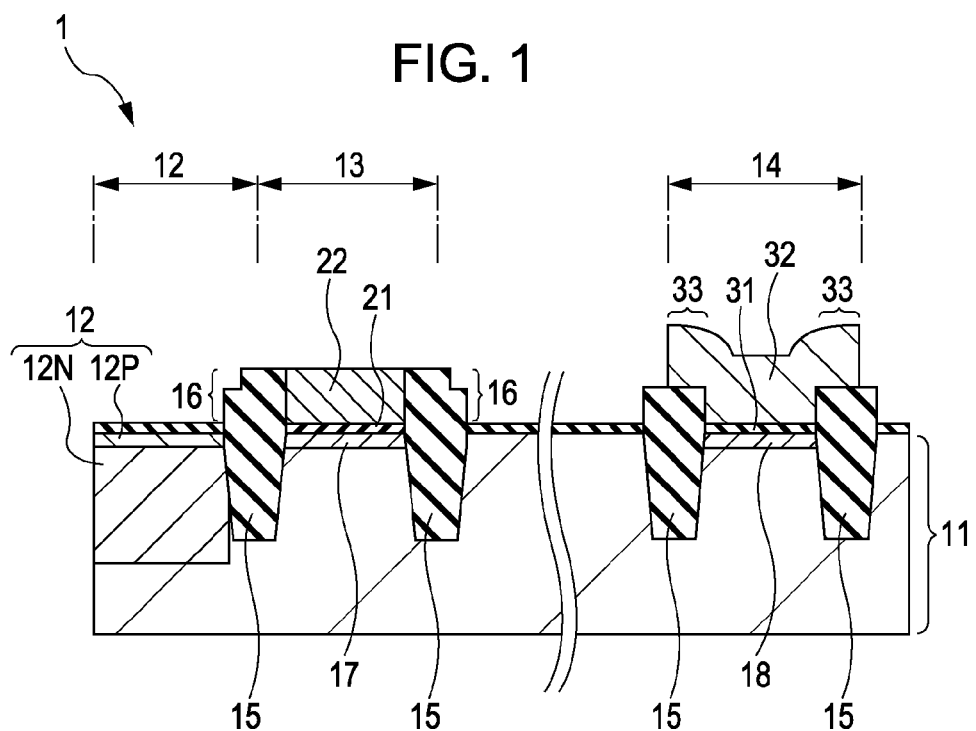
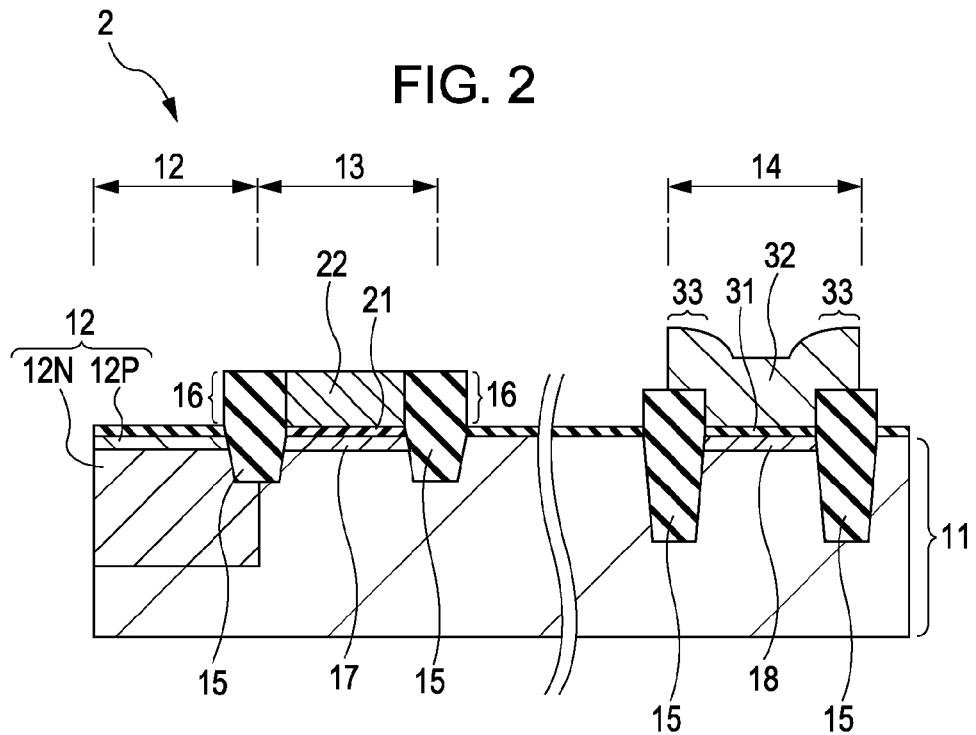

SOLID-STATE IMAGE CAPTURING DEVICE, METHOD OF MANUFACTURING SOLID-STATE IMAGE CAPTURING DEVICE, AND IMAGE CAPTURING APPARATUS

BACKGROUND OF THE INVENTION

1. Field of the Invention

The present invention relates to a solid-state image capturing device, a method of manufacturing the solid-state image capturing device, and an image capturing apparatus.

2. Description of the Related Art

With the miniaturization of each pixel of a CMOS image sensor, the area of a pixel transistor with respect to a photodiode in a unit pixel becomes larger.

When a ratio of the area of the pixel transistor in the unit pixel becomes larger, the area of the photodiode becomes smaller. For this reason, a problem with a reduction in sensitivity may arise. As shown in FIG. 13, some (for example, oblique incident light) of light L incident on gate electrodes 120 of the pixel transistor may be reflected or absorbed. Therefore, due to a reduction in light arriving to the photodiode 110, the problem of the deterioration in sensitivity may arise.

Since it is necessary to ensure the area corresponding to an overlapped area of the pixel transistor on an isolation area, a problem may arise in that the area of the photodiode may not be expanded and the number of saturation electrons is reduced.

In recent years, the number of sensitivity electrons and the number of saturation electrons have also been reduced with the reduction in a pixel size. For this reason, a problem may arise in that the output voltage of a signal of a pixel is reduced. Therefore, it is preferable to improve the efficiency (conversion efficiency) of converting electrons to voltage in a pixel. As shown in FIG. 14, however, a problem may arise in that a gate capacity is increased when the overlapped portions of the gate electrodes 120 on the isolation area 130 are large.

When the overlapped portions of the gate electrodes 120 on the isolation area 130 are large even with the miniaturization of the element, the occupation area of a photodiode 110 has to be decreased, thereby resulting in the deterioration in sensitivity.

In order to solve the above-mentioned problems, it is necessary to reduce the overlapped portion of the transistor on the isolation area. However, when the overlapped portions of the gate electrode are reduced, as shown in FIG. 15, for example, a gap 125 may occur in a gate width direction of the gate electrode 120 in a case of the occurrence of a join gap in an exposure device. In this case, when ions are implanted to form source and drain areas 141 and 142, the ions are implanted from the gap 125 to a semiconductor substrate 100 and the source and drain areas 141 and 142 may be formed in a shorted state.

There was suggested a method of manufacturing a gate electrode using a self-alignment technique as a technique capable of solving an overlapped portion of a polysilicon gate in an SRAM or the like (for example, see Japanese Unexamined Patent Application Publication No. 2006-93222). With this manufacturing method, it is difficult to take contacts when a transistor wit with a short gate length (L length) is manufactured with a logic circuit of a peripheral circuit section. Therefore, in a solid-state image capturing element or the like, it is difficult to mount a gate electrode, which has to be formed with a minute pattern, of a peripheral circuit section and a gate electrode of a pixel section together on a chip.

SUMMARY OF THE INVENTION

A problem to be solved is that when a gate electrode of a peripheral circuit section is formed to overlap on an isolation area to take the contact with the reduction in a pixel size, a gate electrode of a pixel transistor section is also formed to overlap on the isolation area.

It is desirable to prevent the occupation area of a photoelectric conversion unit (photodiode) from being reduced with a reduction of a pixel size and to enable improved sensitivity by forming a gate electrode of a pixel transistor section so as not to overlap on an isolation area.

A solid-state image capturing device according to an embodiment of the invention includes, in a semiconductor substrate, a photoelectric conversion section which performs photoelectric conversion on incident light to obtain signal charges; a pixel transistor section which outputs the signal charges generated in the photoelectric conversion section; a peripheral circuit section which is formed in the periphery of a pixel section including the photoelectric conversion section and the pixel transistor section; and isolation areas which electrically separate the photoelectric conversion section, the pixel transistor section, and the peripheral circuit section from each other. The isolation areas in the periphery of the pixel transistor section each have an insulating section formed higher than a surface of the semiconductor substrate. A first gate electrode of a transistor of the pixel transistor section is formed between the insulating sections and on the semiconductor substrate with a gate insulating film interposed therebetween.

In the solid-state image capturing device according to the embodiment of the invention, since the first gate electrode of the transistor is formed between the insulating sections of the isolation areas, the first gate electrode is formed so as not to overlap on the isolation areas. Accordingly, the occupation area of the photoelectric conversion section is inhibited from being reduced with the miniaturization of a pixel size, and thus the sensitivity is inhibited from deteriorating. Alternatively, the sensitivity can be improved.

A method of manufacturing a solid-state image capturing device according to an embodiment of the invention includes the steps of: forming isolation areas which electrically separate a photoelectric conversion unit, a pixel transistor section, and a peripheral circuit section from each other and which each include an insulating section formed higher than a surface of the semiconductor substrate; forming a gate insulating film in an area where the pixel transistor section of the semiconductor substrate is formed; forming a first gate electrode forming film to cover the entire surface of the semiconductor substrate; exposing surfaces of the insulating sections of the isolation areas by removing the first gate electrode forming film so that the first gate electrode forming film remains in the area where the pixel transistor section is formed; forming a first gate electrode in the pixel transistor section using the first gate electrode forming film and removing the first gate electrode forming film on the photoelectric conversion section and the peripheral circuit section; forming an etching prevention film covering the first gate electrode; forming a second gate electrode forming film to cover the entire surface of the semiconductor substrate; and forming a second gate electrode of a transistor of the peripheral circuit section using the second gate electrode forming film in a state where the first gate electrode covered with the etching prevention film remains.

In the method of manufacturing the solid-state image capturing device according to the embodiment of the invention, since the first gate electrode of the transistor is formed between the insulating sections of the isolation areas, the first gate electrode of the pixel transistor section is formed so as not to overlap on the isolation areas. Accordingly, the occupation area of the photoelectric conversion section is inhibited from being reduced with the miniaturization of a pixel size, and thus the sensitivity is inhibited from deteriorating. Alternatively, the sensitivity can be improved.

An image capturing apparatus according to an embodiment of the invention includes: a light condensing optical unit which condenses incident light; an image capturing unit which includes a solid-state image capturing device receiving the light condensed by the light condensing optical unit and performing photoelectric conversion; and a signal processing unit which processes a signal subjected to the photoelectric conversion. The solid-state image capturing device includes, in a semiconductor substrate, a photoelectric conversion section which performs the photoelectric conversion on incident light to obtain signal charges; a pixel transistor section which outputs the signal charges generated in the photoelectric conversion section; a peripheral circuit section which is formed in the periphery of a pixel section including the photoelectric conversion section and the pixel transistor section; and isolation areas which electrically separate the photoelectric conversion section, the pixel transistor section, and the peripheral circuit section from each other. The isolation areas in the periphery of the pixel transistor section each have an insulating section formed higher than a surface of the semiconductor substrate. A first gate electrode of a transistor of the pixel transistor section is formed between the insulating sections and on the semiconductor substrate with a gate insulating film interposed therebetween.

In the image capturing apparatus according to the embodiment of the invention, the solid-state image capturing device according to the embodiment of the invention is used in which the first gate electrode of the transistor is formed between the insulating sections of the isolation areas and which is capable of forming an image with high sensitivity.

In the solid-state image capturing device according to the embodiment of the invention, the first gate electrode of the pixel transistor section is formed so as not to overlap on the isolation areas. With such a configuration, there are advantages that the occupation area of the photoelectric conversion section is inhibited from being reduced with the reduction in a pixel size and the sensitivity is improved.

In the method of manufacturing the solid-state image capturing device according to the embodiment of the invention, the first gate electrode of the pixel transistor section is formed so as not to overlap on the isolation areas. With such a configuration, there are advantages that the occupation area of the photoelectric conversion section is inhibited from being reduced with the reduction in a pixel size and the sensitivity is improved.

The image capturing apparatus according to the embodiment of the invention uses the solid-state image capturing device according to the embodiment of the invention which is capable of forming an image with high sensitivity even when a pixel size is reduced. Accordingly, an advantage of forming an image with high sensitivity is obtained.

BRIEF DESCRIPTION OF THE DRAWINGS

FIG. 1 is a schematic sectional view illustrating a first exemplary configuration of a solid-state image capturing device according to a first embodiment.

FIG. 2 is a schematic sectional view illustrating a second exemplary configuration of the solid-state image capturing device.

DESCRIPTION OF THE PREFERRED EMBODIMENTS

Figure 3:
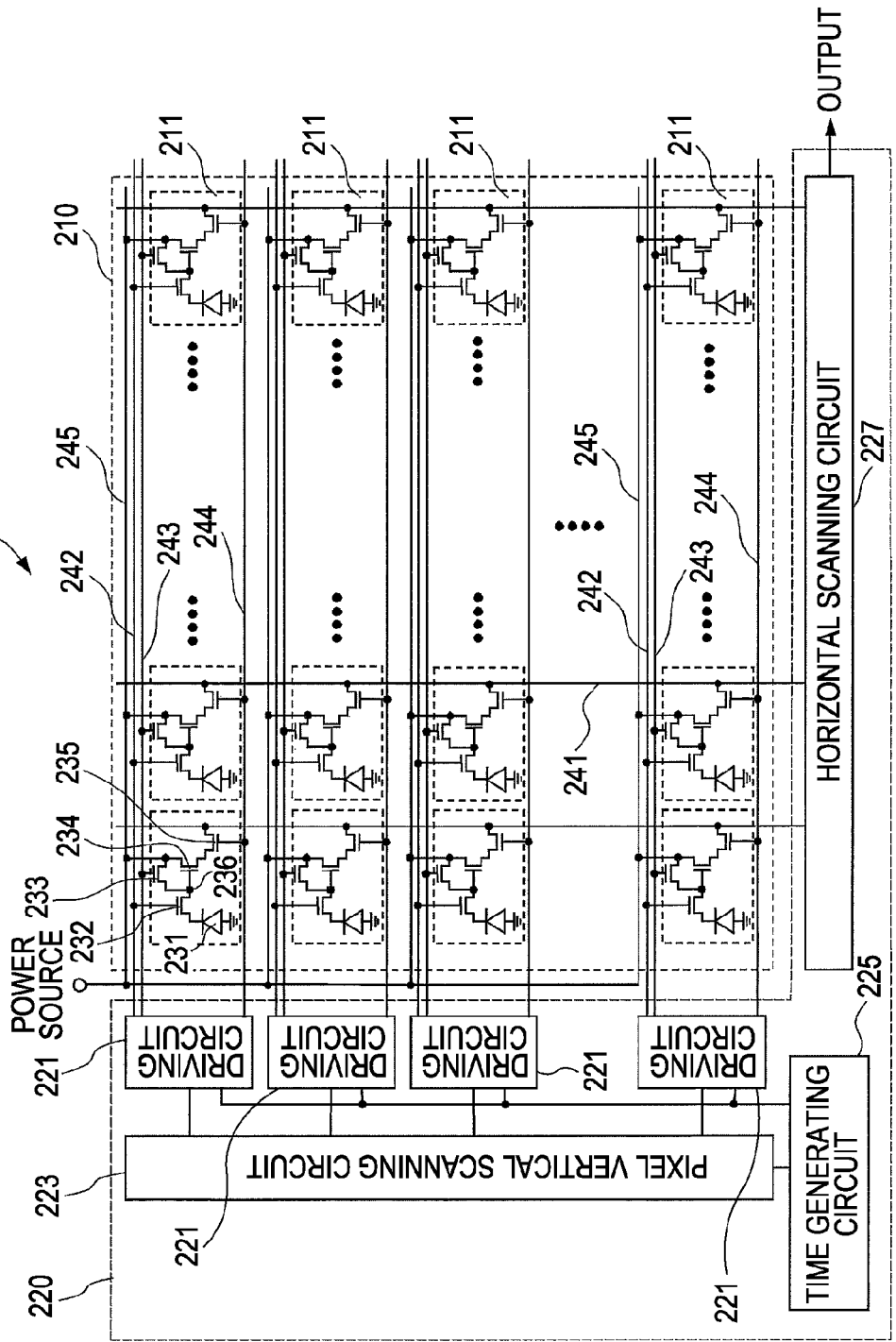
FIG. 3 is a circuit diagram illustrating a CMOS image sensor to which the solid-state image capturing device according to the embodiment of the invention is applied.

Hereinafter, preferred embodiments (hereinafter, referred to as embodiments) of the invention will be described.
First Embodiment
First Exemplary Configuration of Solid-State Image Capturing Device A first exemplary configuration of a solid-state image capturing device according to a first embodiment of the invention will be described with reference to a schematic sectional view of FIG. 1.

As shown in FIG. 1, a semiconductor substrate 11 is provided with a photoelectric conversion section 12 performing photoelectric conversion on incident light to obtain signal charges and a pixel transistor section 13 outputting the signal charges generated in the photoelectric conversion section 12. A peripheral circuit section 14 is formed in the periphery of a pixel section including the photoelectric conversion section 12 and the pixel transistor section 13. Isolation areas 15 are formed to electrically separate the photoelectric conversion section 12, the pixel transistor section 13, and the peripheral circuit section 14 from each other. The isolation area 15 has an insulating section 16 formed higher than the surface of the semiconductor substrate 11 in the periphery of the pixel transistor section 13.

The semiconductor substrate 11 is formed of a general silicon substrate, for example. The photoelectric conversion section 12 includes an N type area 12N and a P+ type area 12P formed on the N type area 12N.

The isolation area 15 has an STI (Shallow Trench Isolation) structure, for example.

Impurity areas 17 and 18 configured to adjust a threshold value voltage (Vth) are formed in an area formed by the pixel transistor section 13 and a transistor-formed area of the peripheral circuit section 14 in the semiconductor substrate 11.

In the area where the pixel transistor section 13 of the semiconductor substrate 11 is formed, a first gate electrode 22 is formed with a gate insulating film 21 interposed therebetween. The first gate electrode 22 is formed between the insulating sections 16 and on the semiconductor substrate 11 with the gate insulating film 21 interposed therebetween.

With such a configuration, the first gate electrode 22 does not overlap on the isolation areas 15.

The gate insulating film 21 is formed of a silicon oxide film, for example. Of course, the gate insulating film 21 may be formed of a gate insulating film material used for a general MOS transistor, as well as a silicon oxide film.

The first gate electrode 22 is formed of a conductive polysilicon, for example.

Even though not shown, source and drain areas are formed on both sides of the first gate electrode 22 on the semiconductor substrate 11. In this way, pixel transistors are formed in the pixel transistor section 13.

In the drawing, a representative transistor is illustrated. However, the pixel transistor section 13 generally includes four transistors, that is, a transmission transistor, a reset transistor, an amplification transistor, and a selection transistor. Alternatively, the pixel transistor section 13 may include three transistors.

Alternatively, a pixel transistor group of the reset transistor, the amplification transistor, and the selection transistor may serve as a common pixel transistor of two photoelectric conversion sections. Alternatively, the pixel transistor group may serve as a common pixel transistor of four photoelectric conversion sections.

On the other hand, in a transistor of the peripheral circuit section 14, a second gate electrode 32 is formed on the semiconductor substrate 11 with a gate insulating film 31 interposed therebetween. At least one end of the second gate electrode 32 is formed to overlap on the isolation areas 15 configured to separate the peripheral circuit section 14.

Parts of the second gate electrode 32 formed on the isolation areas 15 serve as contact portions 33 configured to connect other wires to each other. The contact portions 33 are formed so that parts thereof formed on the isolation areas 15 of the second gate electrode 32 have a wide width.

The gate insulating film 31 is formed of a silicon oxide film, for example. Of course, the gate insulating film 31 may be formed of an insulating material used for a gate insulating film transistor, as well as a silicon oxide film. For example, the gate insulating film 31 may be formed of an aluminum oxide film or a hafnium oxide film with high dielectric constant. The second gate electrode forming film 43 is formed of a polysilicon film, for example. Alternatively, the second gate electrode forming film 43 may be formed of metal such as tungsten (W), for example.

Even though not shown, source and drain areas are formed on both sides of the first gate electrode 22 and the second gate electrode 32. In addition, a protective film is formed on the photoelectric conversion section 12, the pixel transistor section 13, and the peripheral circuit section 14. In addition, a color filter, a micro lens, and the like are further formed. In this way, the solid-state image capturing device 1 is formed.

In the first exemplary configuration of the solid-state image capturing device, the first gate electrode 22 of the transistor only in the pixel transistor section 13 is formed between the insulating sections 16 of the isolation areas 15. With such a configuration, the first gate electrode 22 in the pixel transistor section 13 is formed so as not to overlap on the isolation areas 15. Accordingly, the occupation area of the photoelectric conversion section 12 is inhibited from being reduced with the miniaturization of a pixel size, and thus the sensitivity is inhibited from deteriorating. Alternatively, the sensitivity can be improved.

Since the first gate electrode 22 is formed so as not to overlap on the isolation areas 15, carriers do not occur below the isolation areas 15 upon turning on the pixel transistor. Accordingly, since it is possible to solve the problem with a noise occurring when carriers are mixed in the photoelectric conversion section 12 as in the related art, a high-quality image can be captured.

In the peripheral circuit section 14, even when the gate length of the second gate electrode 32 is the gate length of a cutting-edge process, both the end portions of the second gate electrode 32 are formed to overlap on the isolation areas 15. Accordingly, the second gate electrode 32 can have the contact portions 33 taking the contact of the parts of the second gate electrode 32 on the isolation areas 15.

Second Exemplary Configuration of Solid-State Image Capturing Device

A second exemplary configuration of the solid-state image capturing device according to the first embodiment of the invention will be described with reference to a schematic sectional view of FIG. 2. The solid-state image capturing device with the second exemplary configuration is generally the same as the solid-state image capturing device 1 with the first exemplary configuration, but is different from each other in the following configuration. That is, the height of the isolation areas 15 in the periphery of the pixel transistor section 13 from the surface of the semiconductor substrate 11 is formed higher than the height of the isolation areas 15 in the periphery of the peripheral circuit section 14 from the surface of the semiconductor substrate 11.

As shown in FIG. 2, a semiconductor substrate 11 is provided with a photoelectric conversion section 12 performing photoelectric conversion on incident light to obtain signal charges and a pixel transistor section 13 outputting the signal charges generated in the photoelectric conversion section 12. A peripheral circuit section 14 is formed in the periphery of a pixel section including the photoelectric conversion section 12 and the pixel transistor section 13. Isolation areas 15 are formed to electrically separate the photoelectric conversion section 12, the pixel transistor section 13, and the peripheral circuit section 14 from each other. The isolation area 15 has an insulating section 16 formed higher than the surface of the semiconductor substrate 11 in the periphery of the pixel transistor section 13.

As for the isolation areas 15, the height of the isolation areas 15 in the periphery of the pixel transistor section 13 from the surface of the semiconductor substrate 11 is formed higher than the height of the isolation areas 15 in the periphery of the peripheral circuit section 14 from the surface of the semiconductor substrate 11. For example, the isolation areas in the periphery of the pixel transistor section are formed higher by about 30 nm to 100 nm. In addition, the isolation areas 15 in the periphery of the pixel transistor section 13 may be formed shallow to the degree that the isolation areas 15 are formed high.

The semiconductor substrate 11 is formed of a general silicon substrate, for example. The photoelectric conversion section 12 includes an N type area 12N and a P+ type area 12P formed on the N type area 12N.

The isolation area 15 has an STI (Shallow Trench Isolation) structure, for example.

Impurity areas 17 and 18 configured to adjust a threshold value voltage (Vth) are formed in a formation of area of the pixel transistor section 13 and a transistor-formed area of the peripheral circuit section 14 in the semiconductor substrate 11.

In the area where the pixel transistor section 13 of the semiconductor substrate 11 is formed, a first gate electrode 22 is formed with a gate insulating film 21 interposed therebetween. The first gate electrode 22 is formed between the insulating sections 16 and on the semiconductor substrate 11 with the gate insulating film 21 interposed therebetween.

With such a configuration, the first gate electrode 22 does not overlap on the isolation areas 15.

The gate insulating film 21 is formed of a silicon oxide film, for example. Of course, the gate insulating film 21 may be formed of a gate insulating film material used for a general MOS transistor, as well as a silicon oxide film.

The first gate electrode 22 is formed of a conductive polysilicon, for example.

Even though not shown, source and drain areas are formed on both sides of the first gate electrode 22 on the semiconductor substrate 11. In this way, pixel transistors are formed in the pixel transistor section 13.

In the drawing, a representative transistor is illustrated. However, the pixel transistor section 13 generally includes four transistors, that is, a transmission transistor, a reset transistor, an amplification transistor, and a selection transistor. Alternatively, the pixel transistor section 13 may include three transistors.

Alternatively, a pixel transistor group of the reset transistor, the amplification transistor, and the selection transistor may serve as a common pixel transistor of two photoelectric conversion sections. Alternatively, the pixel transistor group may serve as a common pixel transistor of four photoelectric conversion sections.

On the other hand, in a transistor of the peripheral circuit section 14, a second gate electrode 32 is formed on the semiconductor substrate 11 with a gate insulating film 31 interposed therebetween. At least one end of the second gate electrode 32 is formed to overlap on the isolation areas 15 configured to separate the peripheral circuit section 14.

Parts of the second gate electrode 32 formed on the isolation areas 15 serve as contact portions 33 configured to connect other wires to each other. The contact portions 33 are formed so that parts thereof formed on the isolation areas 15 of the second gate electrode 32 have a wide width.

The gate insulating film 31 is formed of a silicon oxide film, for example. Of course, the gate insulating film 31 may be formed of an insulating material used for a gate insulating film transistor, as well as a silicon oxide film. For example, the gate insulating film 31 may be formed of an aluminum oxide film or a hafnium oxide film with high dielectric constant.

The second gate electrode forming film 43 is formed of a polysilicon film, for example. Alternatively, the second gate electrode forming film 43 may be formed of metal such as tungsten (W), for example.

Even though not shown, source and drain areas are formed on both sides of the first gate electrode 22 and the second gate electrode 32. In addition, a protective film is formed on the photoelectric conversion section 12, the pixel transistor section 13, and the peripheral circuit section 14. In addition, a color filter, a micro lens, and the like are further formed. In this way, the solid-state image capturing device 1 is formed.

In the second exemplary configuration of the solid-state image capturing device, the first gate electrode 22 of the transistor only in the pixel transistor section 13 is formed between the insulating sections 16 of the isolation areas 15. With such a configuration, the first gate electrode 22 in the pixel transistor section 13 is formed so as not to overlap on the isolation areas 15. Accordingly, the occupation area of the photoelectric conversion section 12 is inhibited from being reduced with the miniaturization of a pixel size, and thus the sensitivity is inhibited from deteriorating. Alternatively, the sensitivity can be improved.

In the peripheral circuit section 14, even when the gate length of the second gate electrode 32 is the gate length of a cutting-edge process, both the end portions of the second gate electrode 32 are formed to overlap on the isolation areas 15. Accordingly, the second gate electrode 32 can have the contact portions 33 taking the contact of the parts of the second gate electrode 32 on the isolation areas 15.

Moreover, since the height of the isolation areas 15 of the pixel transistor section 13 is formed higher than the height of the isolation areas 15 of the peripheral circuit section 14, for example, the depth of the isolation areas 15 of the pixel transistor section 13 can be formed shallower than that in the related art. With such a configuration, portions below the isolation areas 15 can be used as the photoelectric conversion section 12. Accordingly, the sensitivity can be improved.

Since the first gate electrode 22 is formed so as not to overlap on the isolation areas 15, carriers do not occur below the isolation areas 15 upon turning on the pixel transistor. Accordingly, since it is possible to solve the problem with a noise occurring when carriers are mixed in the photoelectric conversion section 12 as in the related art, a high-quality image can be captured.

Here, an example of a pixel section and a peripheral circuit section of a CMOS solid-state image capturing device as a reference example will be described with reference to a circuit configuration of FIG. 3.

As shown in FIG. 3, a solid-state image capturing device (CMOS image sensor) 201 includes a pixel section 210 in which pixels 211 including a photoelectric conversion element are arranged two-dimensionally in a matrix shape. The solid-state image capturing device 201 includes a peripheral circuit section 220 which includes driving circuits 221 independently controlling control signal lines, a pixel vertical scanning circuit 223, a time generating circuit 225, and a horizontal scanning circuit 227.

In the matrix arrangement of the pixels 211, an output signal line 241 is wired in every column and a control signal lines are wired in every row of the pixels 211. The control signal lines include a transmission control line 242, a reset control line 243, and a selection control line 244, for example. In addition, a reset line 245 supplying a reset voltage is wired to each pixel 211.

An exemplary circuit configuration of the pixel 211 is shown. A unit pixel in this exemplary circuit configuration includes a photodiode as the photoelectric conversion element in a light receiving unit 231 and has a pixel circuit including four transistors, that is, a transmission transistor 232, a reset transistor 233, an amplification transistor 234, and a selection transistor 235. Here, N channel MOS transistors, for example, are used as the transmission transistor 232, the reset transistor 233, the amplification transistor 234, and the selection transistor 235. In the description of the electric configuration, these transistors are called pixel transistors.

The transmission transistor 232 is connected between a cathode electrode of the photodiode of the light receiving unit 231 and a floating diffusion 236 serving as a charge voltage converting unit. The signal charges (here, electrons) subjected to photoelectric conversion by the light receiving unit 231 and stored therein are transmitted to the floating diffusion 236 by applying transmission pulses to a gate electrode (control electrode).

A drain electrode and a source electrode of the reset transistor 233 are connected to the reset line 245 and the floating diffusion 236, respectively. The potential of the floating diffusion 236 is reset with a reset voltage Vrst by applying a reset pulse RST to the gate electrode, before the signal charges are transmitted from the light receiving unit 231 to the floating diffusion 236.

A gate electrode and a drain electrode of the amplification transistor 234 are connected to the floating diffusion 236 and a pixel power source Vdd, respectively. The potential of the floating diffusion 236 reset by the reset transistor 233 is output as a reset level. Moreover, the potential of the floating diffusion 236 after the transmission of the signal charges by the transmission transistor 232 is output as a signal level.

A drain electrode and a source electrode of the selection transistor 235 are connected to a source electrode of the amplification transistor 234 and the output signal line 241, respectively, for example. Then, the gate electrode is turned on by applying a selection pulse SEL to the gate electrode and outputs a signal output from the amplification transistor 234 to the output signal line 241 as a selected state of the pixel 211. Alternatively, the selection transistor 235 may be connected between the pixel power source Vdd and the drain electrode of the amplification transistor 234.

The driving circuit 221 is configured to read the signal of each pixel 211 read in the pixel section 210.

The pixel vertical scanning circuit 223 includes a shift register or an address decoder. By appropriately generating the reset pulse, the transmission pulse, and the selection pulse, or the like, each pixel 211 of the pixel section 210 is read in an electronic shutter row and scanned a vertically (upward and downward) in every row. During this scanning, an electronic shutter operation of sweeping the signals of the pixels 211 of the electronic shutter row is performed for the electronic shutter row. In addition, the electronic shutter operation is performed for the same row (the electronic shutter row) earlier than the reading scanning by the driving circuit 221 by time corresponding to a shutter speed.

The horizontal scanning circuit 227 includes a shift register or an address decoder and performs horizontal scanning in order of the pixel columns of the pixel section 210.

The time generating circuit 225 generates a time signal or a control signal serving as a reference of the operations of the driving circuits 221, the pixel vertical scanning circuit 223, or the like.

2. Second Embodiment

First Exemplary Method of Manufacturing Solid-State Image Capturing Device

A first exemplary method of manufacturing a solid-state image capturing device according to a second embodiment of the invention will be described with reference to sectional views of FIGS. 4A to 4C and FIGS. 5A to 5C.

Figure 4A:
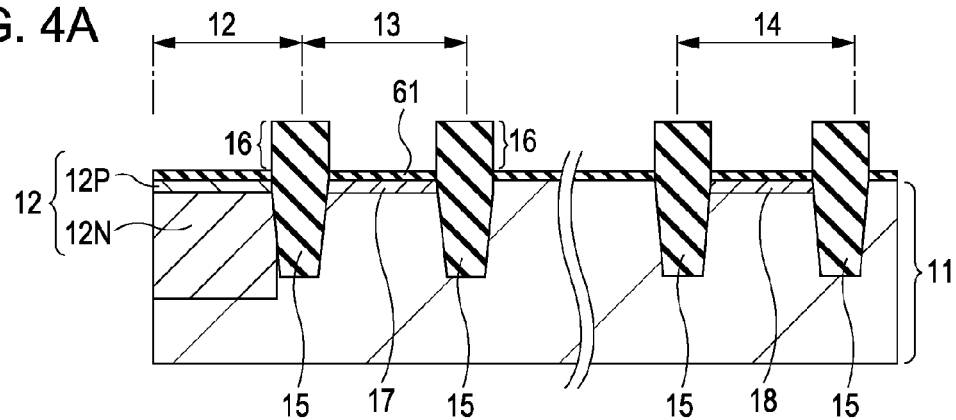
FIGS. 4A to 4C are sectional views illustrating a first exemplary method of manufacturing a solid-state image capturing device according to a second embodiment.

As shown in FIG. 4A, isolation areas 15 are formed which electrically separate a photoelectric conversion section 12, a pixel transistor section 13, and a peripheral circuit section 14 from each other formed on a semiconductor substrate 11 and which each include an insulating section 16 formed higher than the surface of the semiconductor substrate 11.

The semiconductor substrate 11 is formed of a general silicon substrate, for example. The photoelectric conversion section 12 includes an N type area 12N and a P+ type area 12P formed on the N type area 12N.

The isolation area 15 has an STI (Shallow Trench Isolation) structure, for example. In the manufacturing method, a mask insulating film (not shown) used when isolation trenches are formed in the semiconductor substrate 11 is formed with a predetermined height, for example, the height of the insulating section 16 of the isolation area 15. An isolation insulating film forming the isolation area 15 is buried in the isolation trench to remove the isolation insulating film excessively formed on the mask insulating film. This removing process is performed by a chemical mechanical polishing (CMP) method, for example. Subsequently, by removing the mask insulating film, the isolation areas 15 including the insulating sections 16 may be formed.

After the isolation areas 15 are formed, impurity areas 17 and 18 are formed by performing ion-implanting to adjust threshold value voltages (Vth) of the area, where the pixel transistor section 13 is formed on the semiconductor substrate 11, and the area, where the transistors of the peripheral circuit section 14 are formed, for example. Before the ion-implanting, a buffer layer 61 formed of a silicon oxide film, for example, is formed on the semiconductor substrate 11.

Figure 4B:
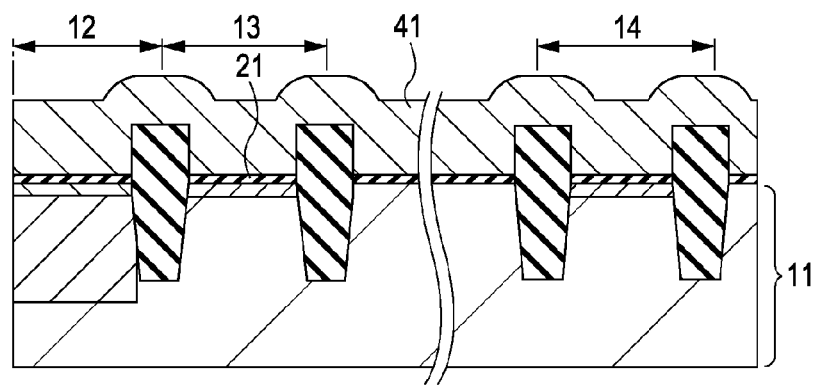

Subsequently, as shown in FIG. 4B, after the silicon oxide film or the like on the semiconductor substrate 11 is removed, the gate insulating film 21 of the pixel transistor is formed in the area where the pixel transistor section 13 is formed. The gate insulating film 21 is formed of a silicon oxide film, for example. The silicon oxide film is formed by thermal oxidation, for example, but may be formed by another film forming method.

A first gate electrode forming film 41 is formed so as to cover the entire surface of the semiconductor substrate 11. The first gate electrode forming film 41 is formed of a silicon oxide film, for example. This polysilicon oxide film is formed by a chemical vapor deposition (CVD) method, for example, but may be formed by another film forming method. The material of the first gate electrode forming film 41 is not limited to the silicon oxide film, but a metal film such as tungsten (W) may be used.

Figure 4C:
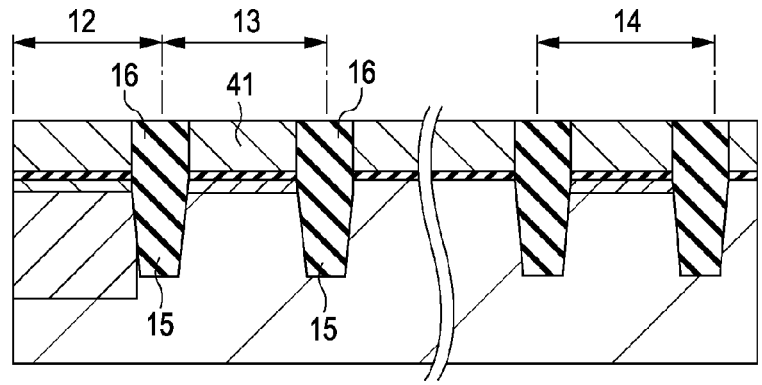

Subsequently, as shown in FIG. 4C, the first gate electrode forming film 41 is removed so that the first gate electrode forming film 41 remains in the area, where the pixel transistor section 13 is formed, to expose the surface of the insulating sections 16 of the isolation areas 15. This exposure process is performed by a chemical mechanical polishing (CMP) method, for example.

Figure 5A:
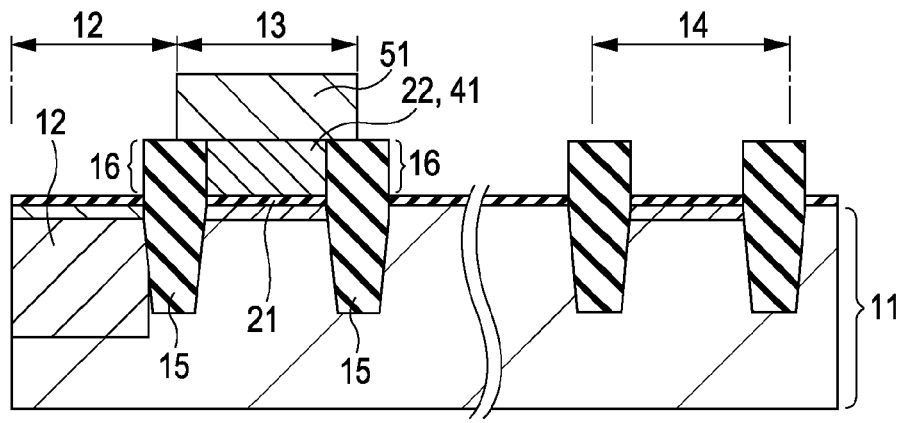
FIGS. 5A to 5C are sectional views illustrating the first exemplary method of manufacturing the solid-state image capturing device.

Subsequently, as shown in FIG. 5A, the first gate electrode 22 is formed of the first gate electrode forming film 41 on the pixel transistor section 13, and the first gate electrode forming film 41 on the photoelectric conversion section 12 and the peripheral circuit section 14 is removed.

In this process, a resist film (not shown) is first formed on the first gate electrode forming film 41 by a general resist application technique. Subsequently, by exposing, developing, and baking the resist film by a lithographic technique, a mask pattern 51 is formed to form the first gate electrode of the pixel transistor section 13. Subsequently, using the mask pattern 51 as a mask, the first gate electrode forming film 41 is etched to form the first gate electrode 22. In addition, the first gate electrode forming film 41 formed on the other areas is removed by etching. In the etching, in order to etch the first gate electrode 22 with high precision, it is preferable to use reactive ion etching (RIE) in which anisotropic dry etching is possible.

In this way, the first gate electrode 22 of the pixel transistor section 13 is formed between the insulating sections 16 of the isolation areas 15 and on the semiconductor substrate 11 with the gate insulating film 21 interposed therebetween.

In general, as described above, the pixel transistor section 13 includes a transmission transistor, a reset transistor, an amplification transistor, and a selection transistor. Accordingly, the transmission transistor, the reset transistor, the amplification transistor, and the selection transistor are formed as the first gate electrode 22. Here, four transistors are formed, but three transistors may be used according to an embodiment of the present invention.

The dry etching is performed under the etching condition that the etching selectivity of the silicon oxide film forming the isolation area 15 and the first gate electrode forming film 41 is guaranteed.

The second gate electrode of the transistor of the peripheral circuit section 14 may not be formed of the first gate electrode forming film 41, since the second gate electrode overlaps on the isolation areas of the peripheral circuit section 14. In this case, the first gate electrode forming film 41 on the peripheral circuit section 14 is removed by the dry etching. At this time, the gate insulating film 21 is also etched, but the gate insulating film 21 may remain on the peripheral circuit section 14 and the photoelectric conversion section 12, as necessary. In this way, the gate insulating film 21 may remain.

Subsequently, the mask pattern 51 is removed. The drawing shows a state just before the mask pattern 51 is removed.

Figure 5B:
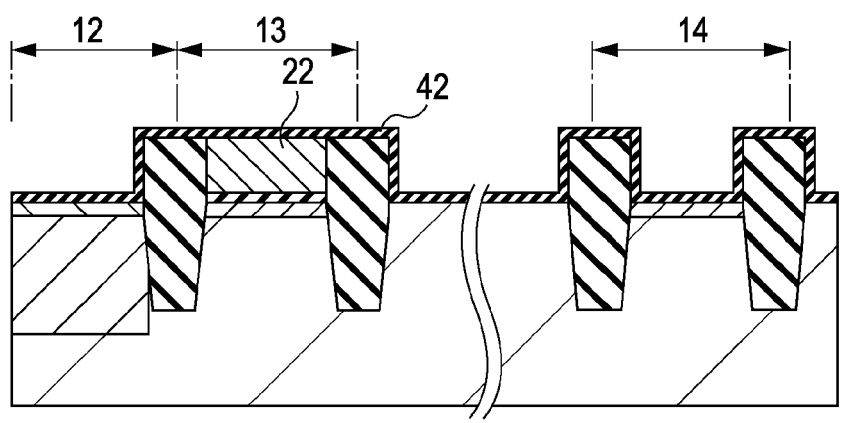

Subsequently, as shown in FIG. 5B, an etching prevention film 42 is formed to cover the first gate electrode 22. The etching prevention film 42 is formed of a silicon nitride film, for example. A method such as a chemical vapor deposition (CVD) method is used to form a film on the entire surface.

Figure 5C:
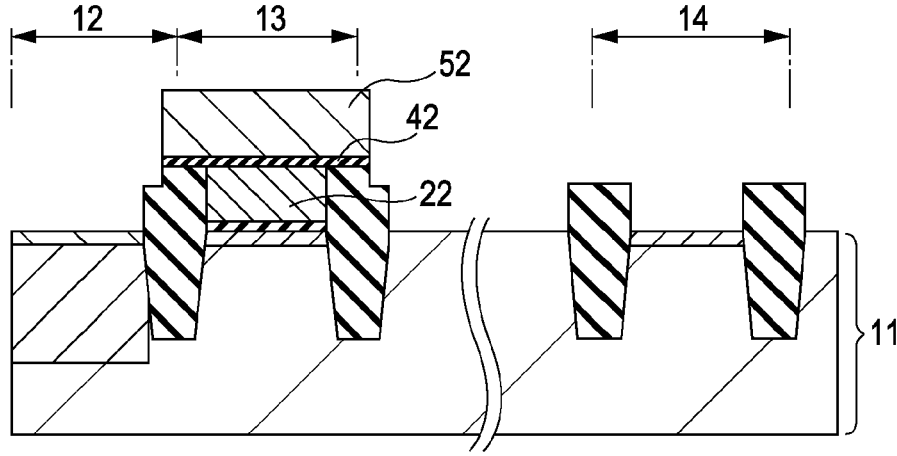

Subsequently, as shown in FIG. 5C, a resist film (not shown) is formed to cover the first gate electrode 22 with the etching prevention film 42 interposed therebetween by a general resist application technique. Subsequently, by exposing, developing, and baking the resist film by a lithographic technique, a mask pattern 52 is formed to cover the first gate electrode 22. Subsequently, the etching prevention film 42 is etched using the mask pattern 52 as an etching mask to remove the etching prevention film 42 other than the etching prevention film covering the first gate electrode 22. Accordingly, the etching prevention film 42 covering the first gate electrode 22 remains. In the etching, it is preferable that wet etching is performed using thermal phosphoric acid so as not to cause etching damage to the semiconductor substrate 11, since the etching prevention film 42 is formed of a silicon nitride film.

In this way, since the silicon nitride film is isotropically etched by the wet etching, no silicon nitride film remains on the side walls of the isolation areas 15.

In this process, in order to form the gate insulating film in the peripheral circuit section 14, the gate insulating film 21 (see FIG. 4B) remaining on the surface of the semiconductor substrate 11 of the peripheral circuit section 14 is removed by anisotropic etching.

When the insulating sections 16 of the isolation areas 15 are set thicker in order to ensure the thickness of the first gate electrode 22, the heights of the isolation areas 15 of the peripheral circuit section 14 are formed low by the anisotropic etching in FIG. 5C. By doing so, it is possible to match the height of the same isolation area as that in a process according to the related art. By forming the height of the isolation areas 15 of the peripheral circuit section 14 from the surface of the semiconductor substrate 11, it is possible to inhibit a side wall film from remaining on the side walls of the isolation areas 15 in a side wall forming process after the gate electrode of the peripheral circuit section 14.

When the height of the isolation areas 15 of the peripheral circuit section 14 is formed low, the process described with reference to FIG. 5A, for example, may be performed. For example, immediately after the mask pattern 52 is formed, the height of the isolation areas 15 can be formed low by selectively etching the isolation areas 15 of the peripheral circuit section 14.

Subsequently, the mask pattern 52 is removed. The drawing shows a state just before the mask pattern 52 is removed.

Figure 6A:
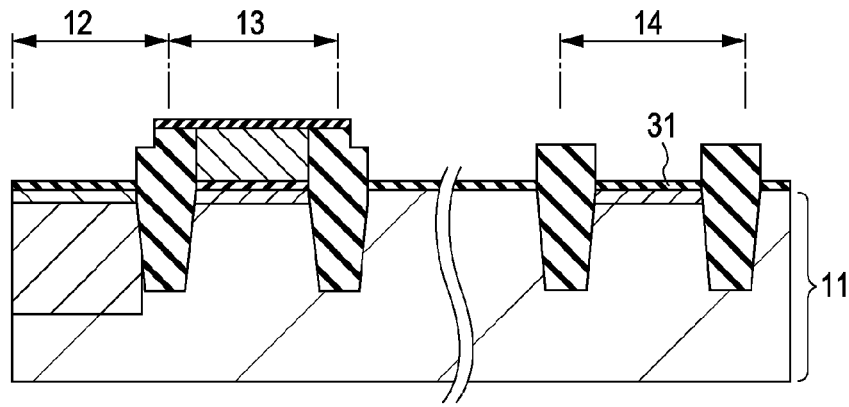
FIGS. 6A to 6C are sectional views illustrating the first exemplary method of manufacturing the solid-state image capturing device.

Subsequently, as shown in FIG. 6A, the gate insulating film 31 is formed on the semiconductor substrate 11 of the peripheral circuit section 14. The gate insulating film 31 is formed of a silicon oxide film, for example. The silicon oxide film is formed by thermal oxidation, for example, but may be formed by another film forming method. Of course, the gate insulating film may be formed of a gate insulating film material used for a general MOS transistor, as well as a silicon oxide film. For example, the gate insulating film may be formed of an aluminum oxide film or a hafnium oxide film with high dielectric constant.

Figure 6B:
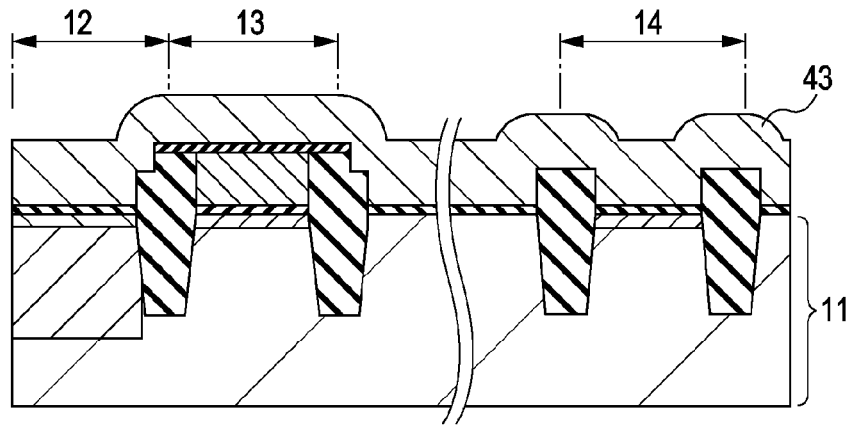

Subsequently, as shown in FIG. 6B, the second gate electrode forming film 43 is formed to cover the entire surface of the semiconductor substrate 11. The second gate electrode forming film 43 is formed of a polysilicon film, for example. This polysilicon oxide film is formed by a chemical vapor deposition (CVD) method, for example, but may be formed by another film forming method. The material of the second gate electrode forming film is not limited to the silicon oxide film, but a metal film such as tungsten (W) may be used.

Figure 6C:
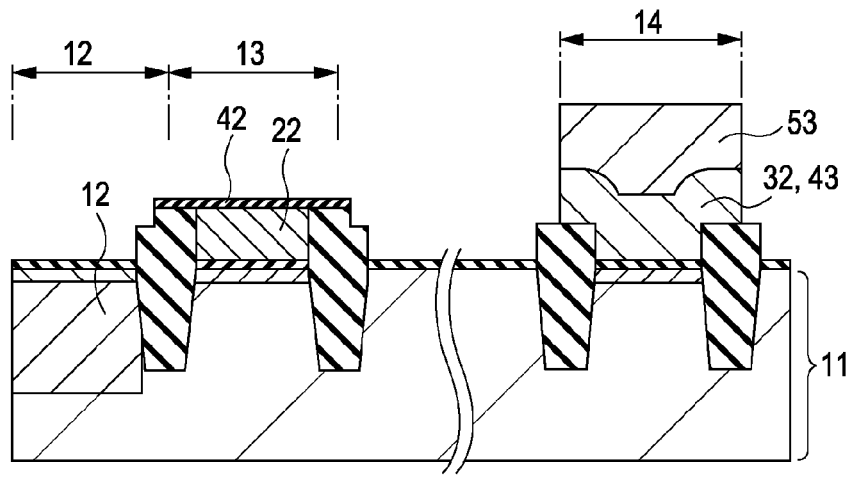

Subsequently, as shown in FIG. 6C, the second gate electrode 32 of the transistor of the peripheral circuit section 14 is formed of the second gate electrode forming film 43 in a state where the first gate electrode 22, in which the etching prevention film 42 is formed, remains. In addition, the second gate electrode forming film 43 on the photoelectric conversion section 12 and the pixel transistor section 13 is removed.

In the process, a resist film (not shown) is formed on the second gate electrode forming film 43 by a general resist application technique. Subsequently, by exposing, developing, and baking the resist film by a lithographic technique, a mask pattern 53 is formed to form the second gate electrode of the transistor of the peripheral circuit section 14. Subsequently, the second gate electrode forming film 43 is etched using the mask pattern 53 as an etching mask to form the second gate electrode 32. In addition, the second gate electrode forming film 43 formed in the other area is removed by etching. In the etching, in order to etch the second gate electrode 32 with high precision, it is preferable to use reactive ion etching (RIE) in which anisotropic dry etching is possible.

In the etching of the second gate electrode forming film 43 of the pixel transistor section 13 in the dry etching, the etching is stopped by the etching prevention film 42. Therefore, the first gate electrode 22 is not etched. The etching prevention film 42 is not limited to a silicon nitride film, as long as the etching prevention film 42 can prevent the etching of the second gate electrode forming film 43. For example, the etching prevention film may be formed of a silicon oxide film, a silicon oxynitride film, a silicon oxycarbide film, or the like.

However, when the insulating sections 16 of the isolation areas 15 on the sides of the first gate electrode 22 are excessively etched upon etching the second gate electrode forming film 43, transistor characteristics may be changed. Therefore, it is preferable to use a silicon nitride film.

Subsequently, the mask pattern 53 is removed. The drawing shows a state just before the mask pattern 53 is removed.

Figure 7A:
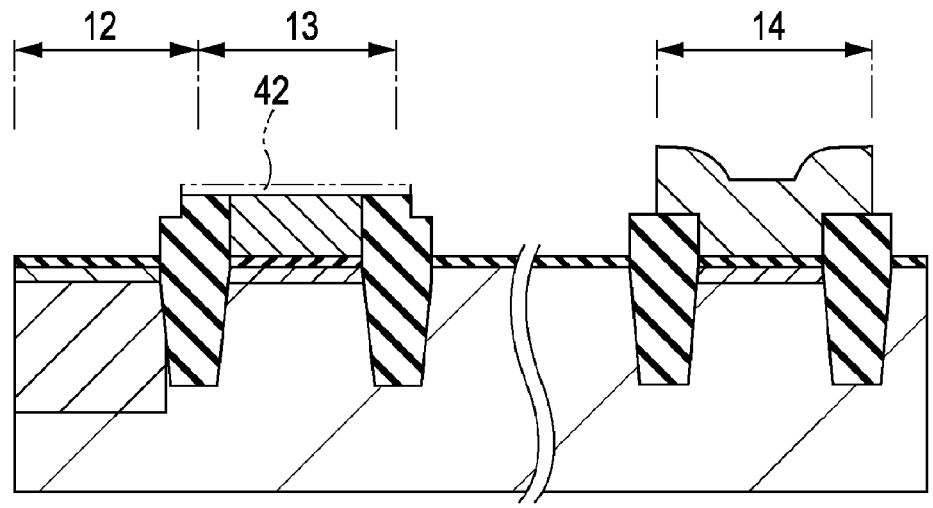
FIGS. 7A and 7B are sectional views illustrating the first exemplary method of manufacturing the solid-state image capturing device.

Subsequently, as shown in FIG. 7A, the etching prevention film 42 (indicated by a long two-dot line) is removed. The etching prevention film 42 is removed by wet etching using thermal phosphoric acid.

Figure 7B:
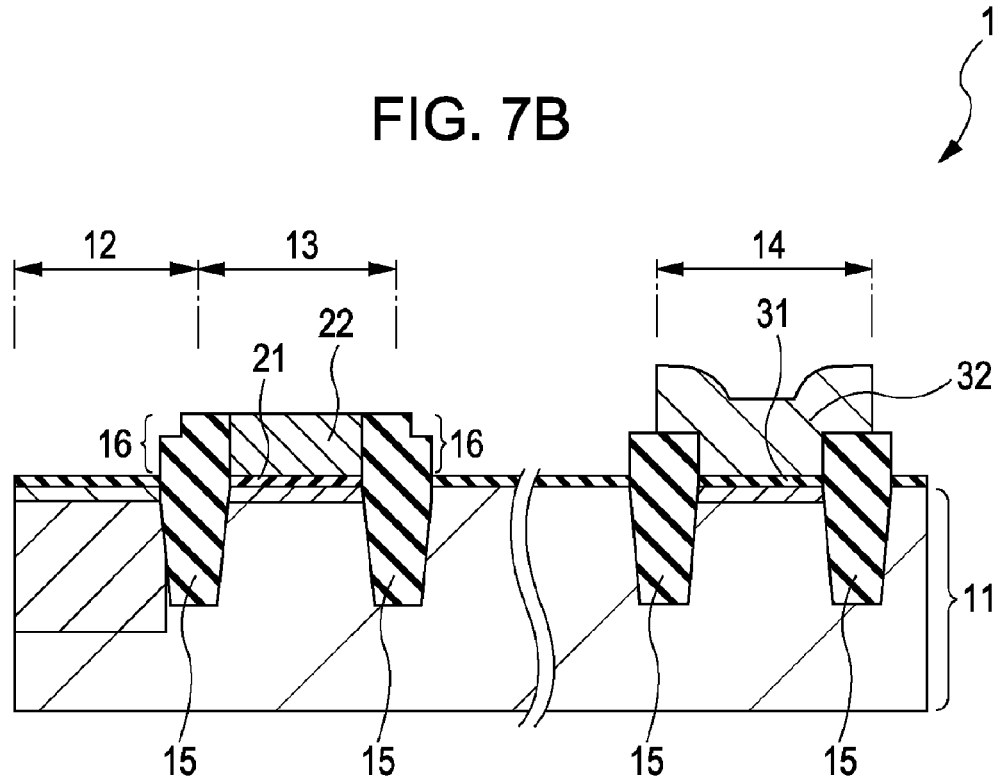

As a consequence, as shown in FIG. 7B, the first gate electrode 22 is formed between the insulating sections 16 of the isolation areas 15 and on the semiconductor substrate 11 of the pixel transistor section 13 with the gate insulating film 21 interposed therebetween. Accordingly, the first gate electrode 22 does not overlap on the isolation areas 15. The second gate electrode 32 of the peripheral circuit section 14 is formed on the semiconductor substrate 11 with the gate insulating film 21 interposed therebetween so that both the end portions thereof overlap on the isolation areas 15.

Subsequently, even though not shown, the source and drain areas are formed, the protective film is formed, the color filter is formed, and the micro lens is formed to complete the solid-state image capturing device 1.

In the manufacturing method, the insulating sections 16 of the isolation areas 15 are formed higher than the height of the first gate electrode 22, when the isolation areas 15 are formed. Moreover, the thickness of the first gate electrode forming film 41 is formed thicker than the desired thickness of the first gate electrode 22, when the first gate electrode forming film 41 is formed. In the process of exposing the surface of the insulating sections 16 of the isolation areas 15, the first gate electrode forming film 41 and the insulating section 16 may be formed up to the desired height of the first gate electrode 22.

In the manufacturing method, the thickness of the first gate electrode 22 is defined by the height of the isolation area 15 from the surface of the semiconductor substrate 11. In a general MOS process, the height of the isolation area 15 is about several tens of nm. Therefore, the height of the isolation area is thinner than the thickness (several hundreds of nm) of the first gate electrode 22. However, when the thickness of the first gate electrode 22 is extremely thin, ions may pass through the first gate electrode 22 in the ion implanting using the first gate electrode 22 as a mask, as in the ion implanting the source and drain, and thus the variation in the transistor characteristics may increase. For this reason, it is preferable that the isolation areas 15 in the state of FIG. 4A, for example, are formed so as to have a height corresponding to that of a general gate electrode.

When the first gate electrode 22 is formed so as not to overlap on the isolation areas 15, the gate electric field of the ends of the isolation areas 15 may become weak. Therefore, the operation capability of the transistor may deteriorate. In this case, after the isolation areas 15 are formed by the process described in FIG. 4A, the isolation areas 15 are retreated from the channel area of the transistor by performing isotropic etching such as pullback. In this way, it is possible to inhibit the operation capability of the transistor due to the weakness of the gate electric field.

In the first exemplary method of manufacturing the solid-state image capturing device, the first gate electrode 22 of only the pixel transistor section 13 is formed between the insulating sections 16 of the isolation areas 15. With such a configuration, the first gate electrode 22 of the pixel transistor section 13 is formed so as not to overlap on the isolation areas 15. Accordingly, the occupation area of the photoelectric conversion section 12 is inhibited from being reduced with the miniaturization of a pixel size, and thus the sensitivity is inhibited from deteriorating. Alternatively, the sensitivity can be improved.

In the first exemplary method of manufacturing the solid-state image capturing device, the first gate electrode forming film 41 is buried between the insulating sections 16 and patterned to form the first gate electrode 22. In other words, the width direction of the gate is determined by the distance between the insulating sections 16, and thus is formed in a self-alignment manner. With such a configuration, the first gate electrode 22 of the pixel transistor section 13 does not overlap on the isolation areas 15, and thus there is no problem of short-circuiting between the drains. Accordingly, it is possible to improve the characteristics and the reliability of the solid-state image capturing device 1.

In the peripheral circuit section 14, even when the gate length of the second gate electrode 32 is the gate length in a cutting-edge process, both the end portions of the second gate electrode 32 are formed to overlap on the isolation areas 15. Accordingly, in the second gate electrode 32, the parts of the second gate electrode 32 on the isolation areas 15 can be formed in the contact portions 33 taking the contact.

When the second gate electrode 32 is formed, the etching prevention film 42 is formed on the first gate electrode 22 and the second gate electrode forming film 43 is formed on the etching prevention film 42 to form the second electrode 32. With such a configuration, when the second gate electrode 32 is formed, the first gate electrode 22 is protected by the etching prevention film 42 and thus is not etched. Accordingly, there is no gap between the first gate electrode 22 and the insulating sections 16 of the isolation areas 15.

In this way, it is possible to manufacture the solid-state image capturing device with high reliability.

Second Exemplary Method of Manufacturing Solid-State Image Capturing Device

A second exemplary method of manufacturing a solid-state image capturing device according to the second embodiment of the invention will be described with reference to sectional views of FIGS. 8A to 8C and FIGS. 11A and 11B. The second exemplary manufacturing method is generally the same as the first exemplary manufacturing method, but is different from the first exemplary manufacturing method in the following configuration. That is, the height of the isolation areas in the periphery of the pixel transistor section 13 from the surface of the semiconductor substrate is formed higher than the height of the isolation areas in the periphery of the peripheral circuit section from the surface of the semiconductor substrate. The other processes are the same as those in the first exemplary manufacturing method.

Figure 8A:
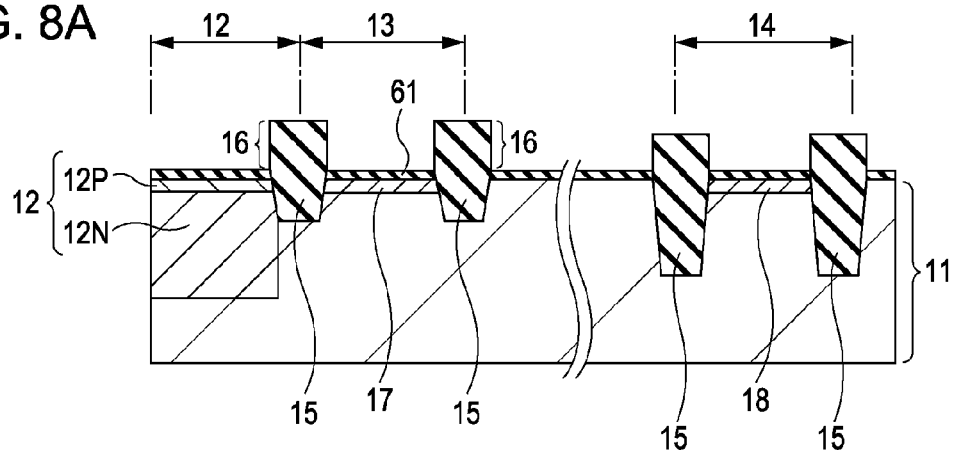
FIGS. 8A to 8C are sectional views illustrating a second exemplary method of manufacturing a solid-state image capturing device according to the second embodiment.

As shown in FIG. 8A, isolation areas 15 are formed which electrically separate a photoelectric conversion section 12, a pixel transistor section 13, and a peripheral circuit section 14 from each other formed on a semiconductor substrate 11 and which each include an insulating section 16 formed higher than the surface of the semiconductor substrate 11.

As for isolation areas 15, the height of the isolation areas 15 in the periphery of the pixel transistor section 13 from the surface of the semiconductor substrate 11 is formed higher than the height of the isolation areas 15 in the periphery of the peripheral circuit section 14 from the surface of the semiconductor substrate 11. For example, the isolation areas in the periphery of the pixel transistor section are formed higher by about 30 nm to 100 nm. In addition, the isolation areas 15 in the periphery of the pixel transistor section 13 may be formed shallow to the degree that the isolation areas 15 are formed high.

The semiconductor substrate 11 is formed of a general silicon substrate, for example. The photoelectric conversion section 12 includes an N type area 12N and a $P^+$ type area 12P formed on the N type area 12N.

The isolation area 15 has an STI (Shallow Trench Isolation) structure, for example.

After the isolation areas 15 are formed, impurity areas 17 and 18 are formed by performing ion-implanting to adjust threshold value voltages (Vth) of the area, where the pixel transistor section 13 is formed on the semiconductor substrate 11, and the area, where the transistors of the peripheral circuit section 14 are formed, for example. Before the ion-implanting, a buffer layer 61 formed of a silicon oxide film, for example, is formed on the semiconductor substrate 11.

Figure 8B:
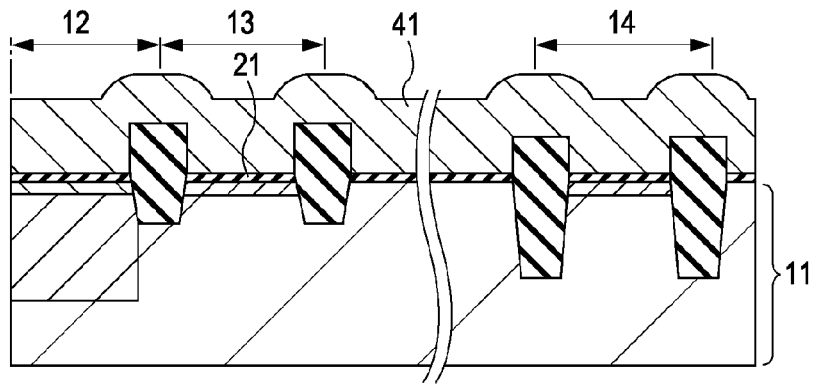

Subsequently, as shown in FIG. 8B, after the silicon oxide film or the like on the semiconductor substrate 11 is removed, the gate insulating film 21 of the pixel transistor is formed in the area where the pixel transistor section 13 is formed. The gate insulating film 21 is formed of a silicon oxide film, for example.

A first gate electrode forming film 41 is formed so as to cover the entire surface of the semiconductor substrate 11. The first gate electrode forming film 41 is formed of a silicon oxide film, for example.

Figure 8C:
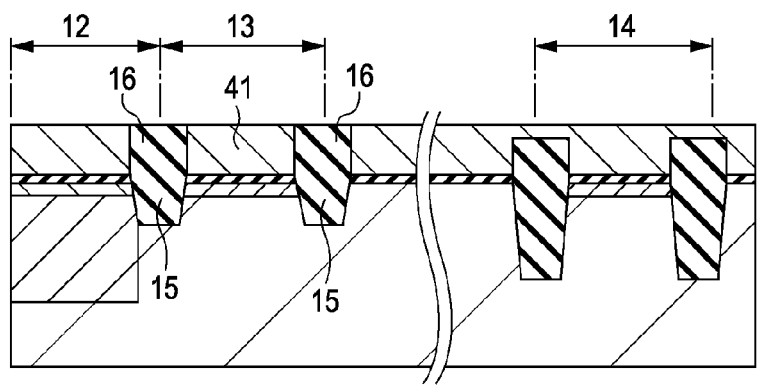

Subsequently, as shown in FIG. 8C, the first gate electrode forming film 41 is removed so that the first gate electrode forming film 41 remains in the area, where the pixel transistor section 13 is formed, to expose the surface of the insulating sections 16 of the isolation areas 15. This exposure process is performed by a chemical mechanical polishing (CMP) method, for example.

Figure 9A:
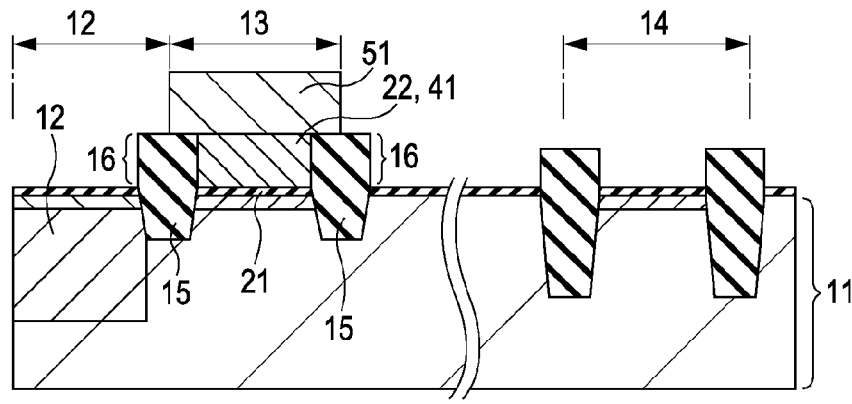
FIGS. 9A to 9C are sectional views illustrating the second exemplary method of manufacturing a solid-state image capturing device.

Subsequently, as shown in FIG. 9A, the first gate electrode 22 is formed of the first gate electrode forming film 41 on the pixel transistor section 13, and the first gate electrode forming film 41 on the photoelectric conversion section 12 and the peripheral circuit section 14 is removed.

In this process, a mask pattern 51 is first formed on the first gate electrode forming film 41 to form the first gate electrode of the pixel transistor section 13. Subsequently, using the mask pattern 51 as a mask, the first gate electrode forming film 41 is etched to form the first gate electrode 22. In addition, the first gate electrode forming film 41 formed on the other areas is removed by etching. In the etching, in order to etch the first gate electrode 22 with high precision, it is preferable to use reactive ion etching (RIE) in which anisotropic dry etching is possible.

In this way, the first gate electrode 22 of the pixel transistor section 13 is formed between the insulating sections 16 of the isolation areas 15 and on the semiconductor substrate 11 with the gate insulating film 21 interposed therebetween.

The dry etching is performed under the etching condition that etching selectivity of the silicon oxide film forming the isolation area 15 and the first gate electrode forming film 41 is guaranteed.

The first gate electrode forming film 41 on the peripheral circuit section 14 is removed by the dry etching. At this time, the gate insulating film 21 is also etched, but the gate insulating film 21 may remain on the peripheral circuit section 14 and the photoelectric conversion section 12, as necessary. In this way, the gate insulating film 21 may remain.

Subsequently, the mask pattern 51 is removed. The drawing shows a state just before the mask pattern 51 is removed.

Figure 9B:
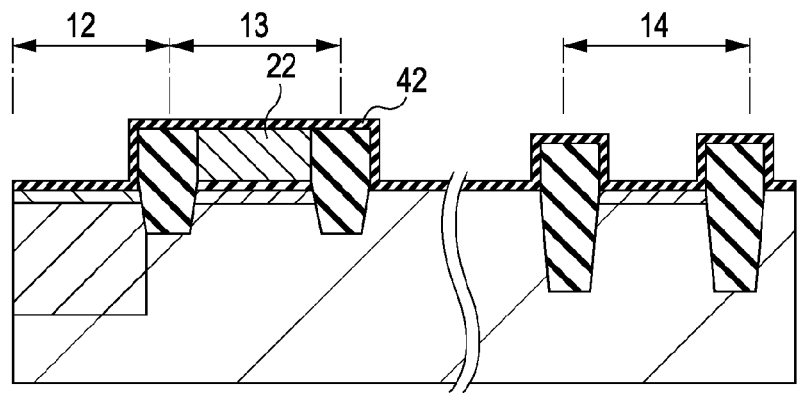

Subsequently, as shown in FIG. 9B, an etching prevention film 42 is formed to cover the first gate electrode 22. The etching prevention film 42 is formed of a silicon nitride film, for example. A method such as a chemical vapor deposition (CVD) method is used to form a film on the entire surface.

Figure 9C:
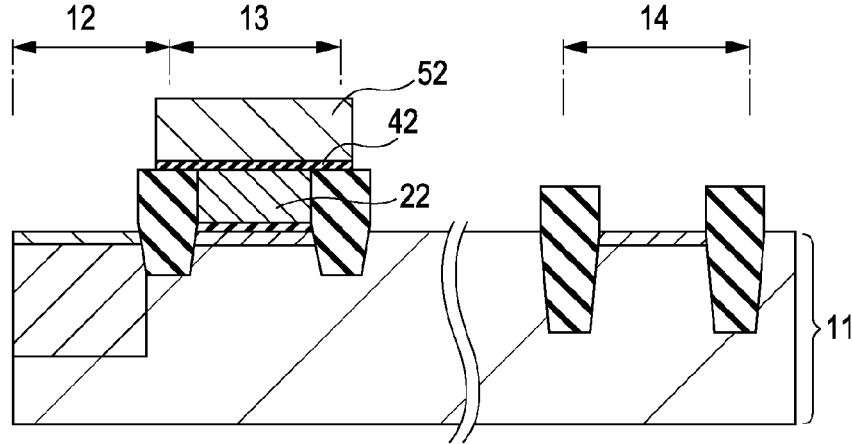

Subsequently, as shown in FIG. 9C, by exposing, developing, and baking the resist film by a lithographic technique, a mask pattern 52 is formed to cover the first gate electrode 22. Subsequently, the etching prevention film 42 is etched using the mask pattern 52 as an etching mask to remove the etching prevention film 42 other than the etching prevention film covering the first gate electrode 22. Accordingly, the etching prevention film 42 covering the first gate electrode 22 remains. In the etching, it is preferable that wet etching is performed using thermal phosphoric acid so as not to cause etching damage to the semiconductor substrate 11, since the etching prevention film 42 is formed of a silicon nitride film.

In this process, in order to form the gate insulating film in the peripheral circuit section 14, the gate insulating film 21 (see FIG. 9A) remaining on the surface of the semiconductor substrate 11 of the peripheral circuit section 14 is removed by anisotropic etching.

Subsequently, the mask pattern 52 is removed. The drawing shows a state just before the mask pattern 52 is removed.

Figure 10A:
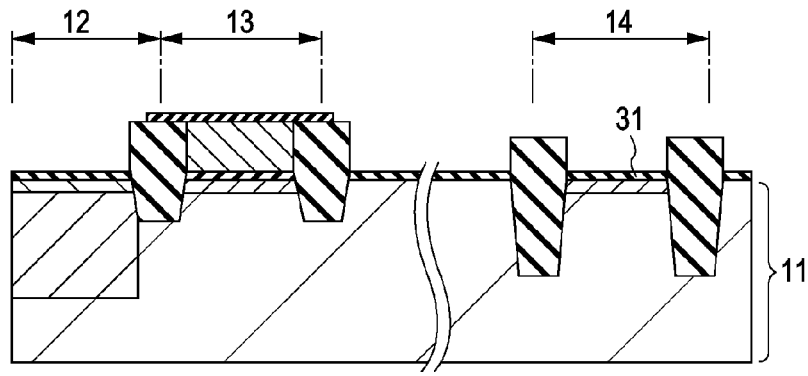
FIGS. 10A to 10C are sectional views illustrating the second exemplary method of manufacturing a solid-state image capturing device.

Subsequently, as shown in FIG. 10A, the gate insulating film 31 is formed on the semiconductor substrate 11 of the peripheral circuit section 14.

Figure 10B:
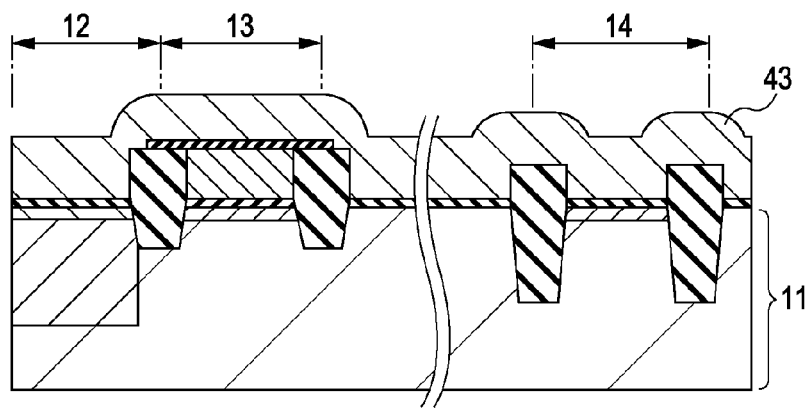

Subsequently, as shown in FIG. 10B, the second gate electrode forming film 43 is formed to cover the entire surface of the semiconductor substrate 11. The second gate electrode forming film 43 is formed of a polysilicon film, for example.

Figure 10C:
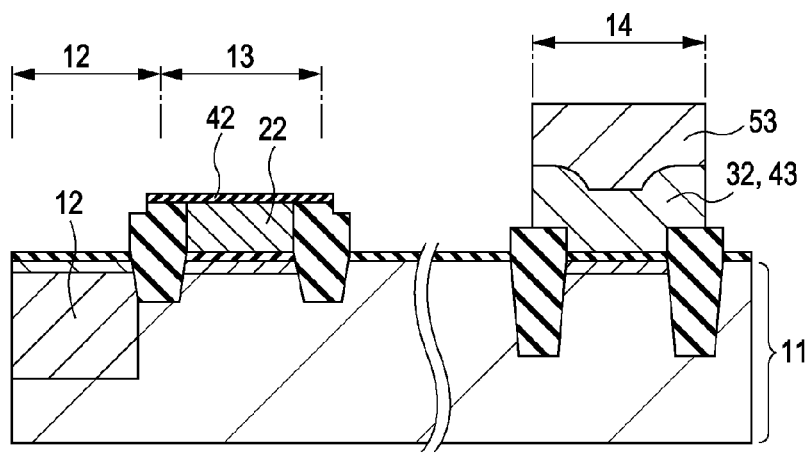

Subsequently, as shown in FIG. 10C, the second gate electrode 32 of the transistor of the peripheral circuit section 14 is formed of the second gate electrode forming film 43 in a state where the first gate electrode 22, in which the etching prevention film 42 is formed, remains. In addition, the second gate electrode forming film 43 on the photoelectric conversion section 12 and the pixel transistor section 13 is removed.

In this process, a mask pattern 53 is first formed on the second gate electrode forming film 43 to form the second gate electrode of the transistor of the peripheral circuit section 14. Subsequently, the second gate electrode forming film 43 is etched using the mask pattern 53 as an etching mask to form the second gate electrode 32. In addition, the second gate electrode forming film 43 formed in the other area is removed by etching. In the etching, in order to etch the second gate electrode 32 with high precision, it is preferable to use reactive ion etching (RIE) in which anisotropic dry etching is possible.

In the etching of the second gate electrode forming film 43 of the pixel transistor section 13 in the dry etching, the etching is stopped by the etching prevention film 42. Therefore, the first gate electrode 22 is not etched.

Subsequently, the mask pattern 53 is removed. The drawing shows a state just before the mask pattern 53 is removed.

Figure 11A:
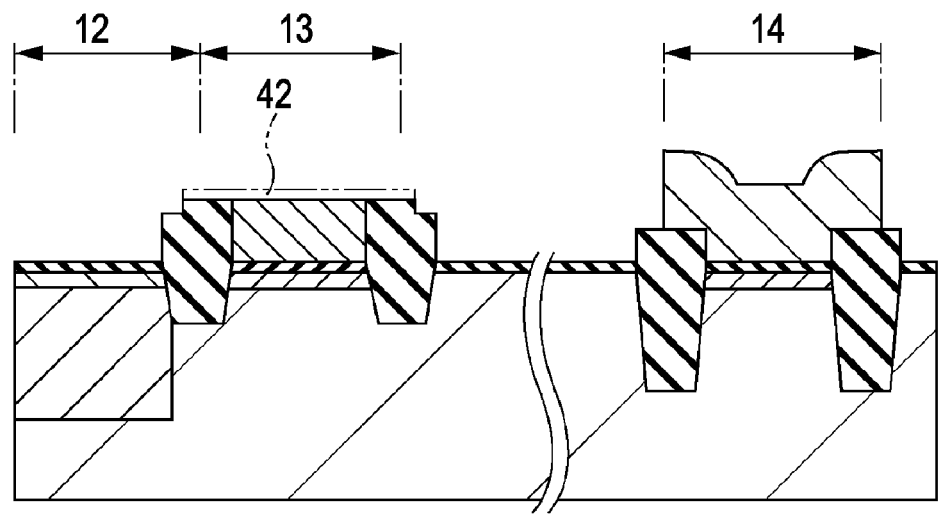
FIGS. 11A and 11B are sectional views illustrating the second exemplary method of manufacturing a solid-state image capturing device.

Subsequently, as shown in FIG. 11A, the etching prevention film 42 (indicated by a long two-dot line) is removed.

Figure 11B:
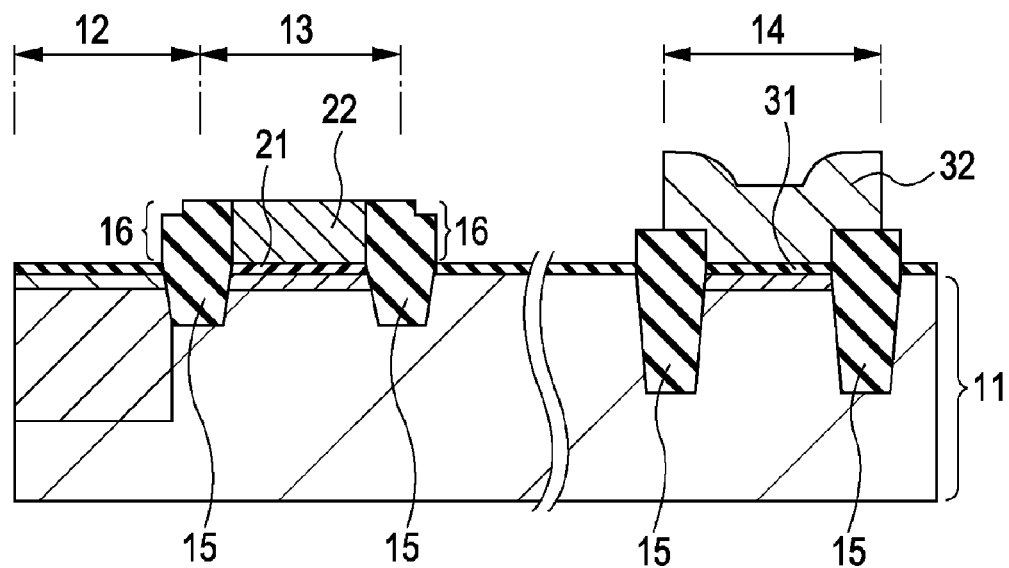

As a consequence, as shown in FIG. 11B, the first gate electrode 22 is formed between the insulating sections 16 of the isolation areas 15 and on the semiconductor substrate 11 of the pixel transistor section 13 with the gate insulating film 21 interposed therebetween. Accordingly, the first gate electrode 22 does not overlap on the isolation areas 15. The second gate electrode 32 of the peripheral circuit section 14 is formed on the semiconductor substrate 11 with the gate insulating film 21 interposed therebetween so that both the end portions thereof overlap on the isolation areas 15.

Subsequently, even though not shown, the source and drain areas are formed, the protective film is formed, the color filter is formed, and the micro lens is formed to complete the solid-state image capturing device 2.

In the second exemplary method of manufacturing the solid-state image capturing device, as in the first exemplary method, the first gate electrode 22 of only the pixel transistor section 13 is formed between the insulating sections 16 of the isolation areas 15. With such a configuration, the first gate electrode 22 of the pixel transistor section 13 is formed so as not to overlap on the isolation areas 15. Accordingly, the occupation area of the photoelectric conversion section 12 is inhibited from being reduced with the miniaturization of a pixel size, and thus the sensitivity is inhibited from deteriorating. Alternatively, the sensitivity can be improved.

The first gate electrode 22 of the pixel transistor section 13 does not overlap on the isolation areas 15, and thus there is no problem of short-circuiting between the drains. Accordingly, it is possible to improve the characteristics and the reliability of the solid-state image capturing device 2.

In the peripheral circuit section 14, even when the gate length of the second gate electrode 32 is the gate length in a cutting-edge process, both the end portions of the second gate electrode 32 are formed to overlap on the isolation areas 15. Accordingly, in the second gate electrode 32, the parts of the second gate electrode 32 on the isolation areas 15 can be formed in the contact portions taking the contact.

When the second gate electrode 32 is formed, the etching prevention film 42 is formed on the first gate electrode 22 and the second gate electrode forming film 43 is formed on the etching prevention film 42 to form the second electrode 32. With such a configuration, when the second gate electrode 32 is formed, the first gate electrode 22 is protected by the etching prevention film 42 and thus is not etched. Accordingly, there is no gap between the first gate electrode 22 and the insulating sections 16 of the isolation areas 15.

In this way, it is possible to manufacture the solid-state image capturing device with high reliability.

Third Embodiment

Exemplary Configuration of Image Capturing Apparatus

Next, an image capturing apparatus according to an embodiment of the invention will be described with reference to a block diagram of FIG. 12. The solid-state image capturing device according to the embodiments of the invention is used in the image capturing apparatus.

Figure 12:
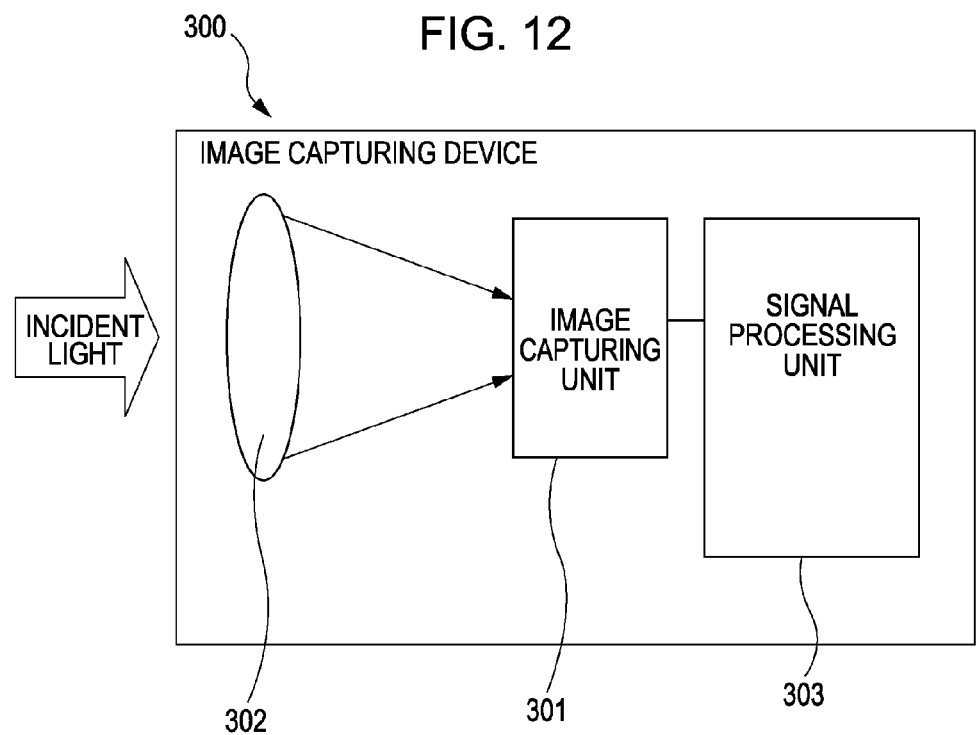
FIG. 12 is a block diagram illustrating an image capturing apparatus according to an embodiment of the invention.
Figure 13:
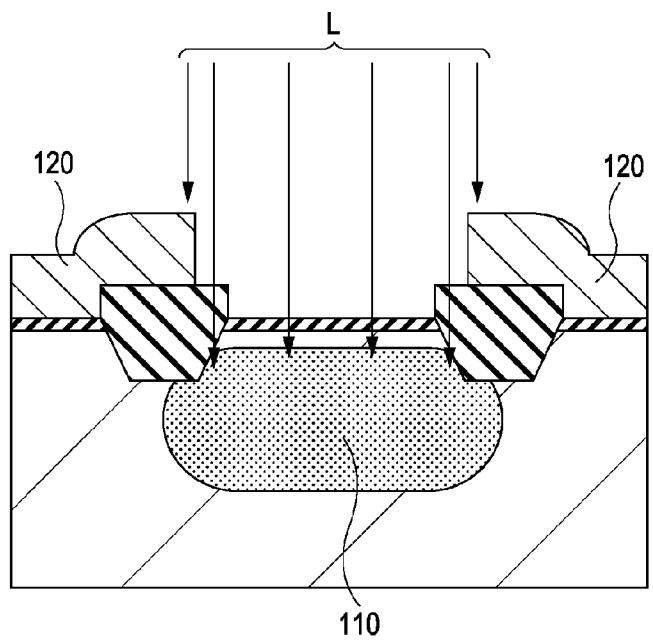
FIG. 13 is a schematic sectional view illustrating the configuration with a problem according to the related art.
Figure 14:
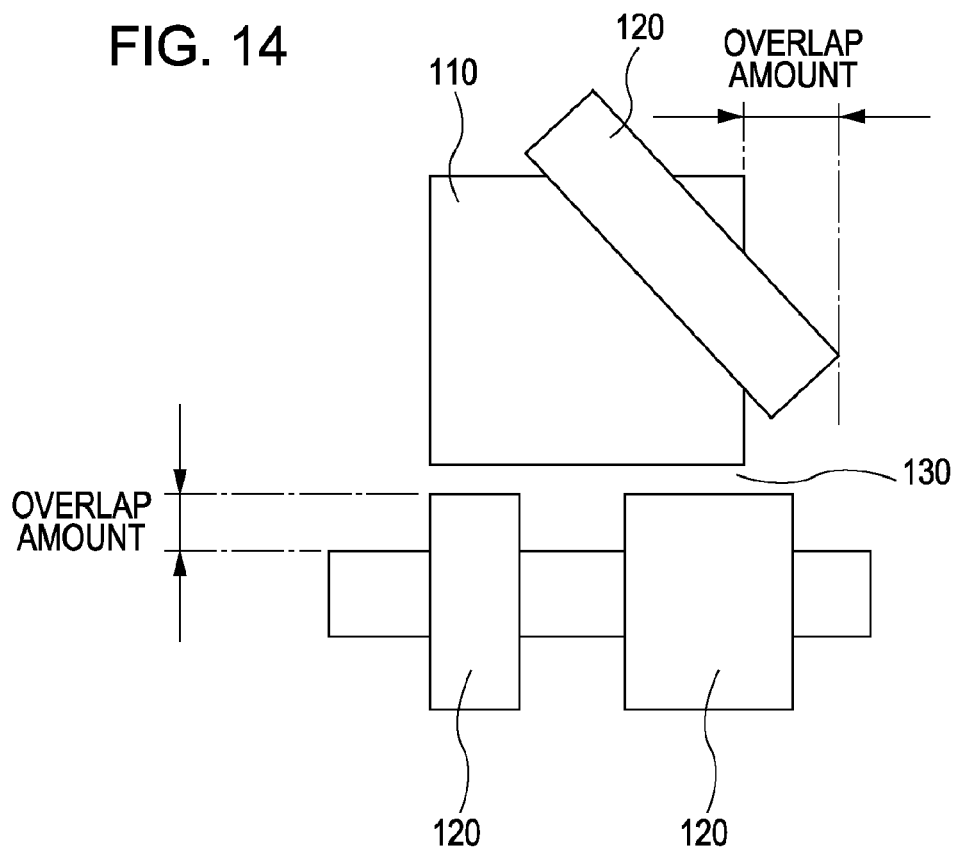
FIG. 14 is a plan view illustrating a layout with a problem according to the related art.
Figure 15:
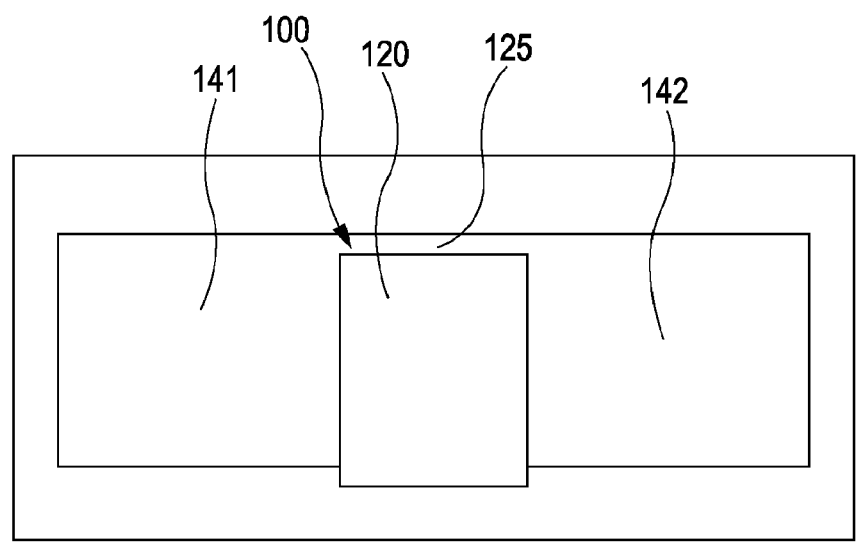
FIG. 15 is a plan view illustrating a layout with a problem according to the related art.

As shown in FIG. 12, an image capturing apparatus 300 includes the solid-state image capturing device (not shown) in an image capturing unit 301. On the light condensing side of the image capturing unit 301, there is provided a light condensing optical unit 302 forming an image. A signal processing unit 303 including a driving circuit configured to drive the image capturing unit 301 and a signal processing circuit configured to process image signals subjected to photoelectric conversion by the solid-state image capturing device. The image signals processed by the signal processing unit 303 may be stored in an image memory (not shown). For the image capturing apparatus 300, the solid-state image capturing device 1 or 2 described according to each embodiment may be used as the solid-state image capturing device of the image capturing unit 301.

The image capturing apparatus 300 according to the embodiment of the invention is capable of forming an image with high sensitivity, since the sensitivity is increased by using the solid-state image capturing device 1 or 2. Since an image quality is inhibited from deteriorating and an image is formed with high sensitivity, an advantage of forming an image with high quality can be obtained even in a dark photographing environment such as night photographing.

The image capturing apparatus 300 according to the embodiment of the invention is not limited to the above-described configuration, but any configuration of an image capturing apparatus using the solid-state image capturing device may be used.

The image capturing apparatus may have a one-chip configuration or a module configuration having an image capturing function formed by organizing and packing the image capturing unit and the signal processing unit or the optical system. Here, the image capturing apparatus refers to a portable apparatus having a camera or an image capturing function. The "image capturing" includes not only taking photographs during normal photography using a camera but also detecting of finger prints in a broad sense.

The present application contains subject matter related to that disclosed in Japanese Priority Patent Application JP 2009-050130 filed in the Japan Patent Office on Mar. 4, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image capturing device comprising, in a semiconductor substrate:
   a photoelectric conversion section which performs photoelectric conversion on incident light to obtain signal charges;
   a pixel transistor section which outputs the signal charges generated in the photoelectric conversion section;
   a peripheral circuit section formed at a periphery of a pixel section which includes the photoelectric conversion section and the pixel transistor section; and
   isolation areas which electrically isolate the photoelectric conversion section, the pixel transistor section, and the peripheral circuit section from each other,
   wherein,
      isolation areas in the periphery of the pixel transistor section each have an insulating section formed to extend higher than a surface of the semiconductor substrate, and
      a first gate electrode of a transistor of the pixel transistor section is formed (1) between the insulating sections and (2) on the semiconductor substrate with a gate insulating film interposed therebetween.

2. The solid-state image capturing device according to claim 1, wherein at least one end of a second gate electrode of a transistor of the peripheral circuit section is formed on the isolation area separating the peripheral circuit section.

3. The solid-state image capturing device according to claim 2, wherein a part of the second gate electrode formed on the isolation area isolating the peripheral section is formed as a contact portion.

4. The solid-state image capturing device according to claim 1, wherein a height of the isolation areas at a periphery of the pixel transistor section from the surface of the semiconductor substrate is higher than a height of the isolation areas at a periphery of the peripheral circuit section from the surface of the semiconductor substrate.

5. A method of manufacturing a solid-state image capturing device, comprising the steps of:
   forming isolation areas which electrically separate a photoelectric conversion unit, a pixel transistor section, and a peripheral circuit section from each other and which each include an insulating section formed higher than a surface of the semiconductor substrate;
   forming a gate insulating film in an area where the pixel transistor section of the semiconductor substrate is formed;
   forming a first gate electrode forming film to cover the entire surface of the semiconductor substrate;
   exposing surfaces of the insulating sections of the isolation areas by removing the first gate electrode forming film so that the first gate electrode forming film remains in the area where the pixel transistor section is formed and on the photoelectric conversion section and the peripheral circuit section;
   forming a first gate electrode in the pixel transistor section using the first gate electrode forming film and removing the first gate electrode forming film on the photoelectric conversion section and the peripheral circuit section;

forming an etching prevention film covering the first gate electrode;

forming a second gate electrode forming film to cover the entire surface of the semiconductor substrate; and forming a second gate electrode of a transistor of the peripheral circuit section using the second gate electrode forming film in a state where the first gate electrode covered with the remains of the etching prevention film.

6. The method according to claim 5, wherein: the insulating sections of the isolation areas are formed higher than the first gate electrode, when the first gate electrode forming film is formed, the thickness of the first gate electrode forming film is formed thicker than a desired thickness of the first gate electrode, and in the exposing of the surfaces of the insulating sections of the isolation areas, the thickness of the first gate electrode forming film together with the insulating sections is formed thin up to the desired thickness of the first gate electrode.

7. The method according to claim 5, wherein a height of the isolation areas in the periphery of the pixel transistor section from the surface of the semiconductor substrate is formed higher than a height of the isolation areas in the periphery of the peripheral circuit section from the surface of the semiconductor substrate.

8. An image capturing apparatus comprising:

a light condensing optical unit which condenses incident light;

an image capturing unit which includes a solid-state image capturing device receiving the light condensed by the light condensing optical unit and performing photoelectric conversion; and a signal processing unit which processes a signal subjected to the photoelectric conversion, wherein the solid-state image capturing device includes in a semiconductor substrate, a photoelectric conversion section which performs the photoelectric conversion on incident light to obtain signal charges;

a pixel transistor section which outputs the signal charges generated in the photoelectric conversion section;

a peripheral circuit section which is formed in the periphery of a pixel section including the photoelectric conversion section and the pixel transistor section; and isolation areas which electrically separate the photoelectric conversion section, the pixel transistor section, and the peripheral circuit section from each other, wherein, the isolation areas in the periphery of the pixel transistor section each have an insulating section formed higher than a surface of the semiconductor substrate, and a first gate electrode of a transistor of the pixel transistor section is formed (1) between the insulating sections and (2) on the semiconductor substrate with a gate insulating film interposed therebetween.

* * * * *